United States Patent
Yamazaki et al.

(10) Patent No.: US 6,777,272 B2
(45) Date of Patent: Aug. 17, 2004

(54) METHOD OF MANUFACTURING AN ACTIVE MATRIX DISPLAY

(75) Inventors: Shunpei Yamazaki, Tokyo (JP); Jun Koyama, Kanagawa (JP); Yasushi Ogata, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 10/259,004

(22) Filed: Sep. 26, 2002

(65) Prior Publication Data

US 2003/0034940 A1 Feb. 20, 2003

Related U.S. Application Data

(62) Division of application No. 08/987,870, filed on Dec. 9, 1997, now abandoned.

(30) Foreign Application Priority Data

Dec. 9, 1996 (JP) .............................................. 8-344574
Oct. 3, 1997 (JP) .............................................. 9-287715

(51) Int. Cl.[7] ...................... H01L 21/00; H01L 21/335; H01L 21/331; H01L 21/332; H01L 21/20

(52) U.S. Cl. ........................... 438/151; 438/30; 438/34; 438/58; 438/66; 438/96; 438/97; 438/143; 438/149; 438/166; 438/310; 438/378; 438/471; 438/482; 438/488; 438/585; 438/778

(58) Field of Search .............................. 438/30, 34, 58, 438/66, 96, 97, 143, 149, 166, 310, 378, 471, 482, 488, 585, 778

(56) References Cited

U.S. PATENT DOCUMENTS

| | | | |
|---|---|---|---|
| 4,644,338 A | * | 2/1987 | Aoki et al. ................. 345/206 |
| 5,585,291 A | | 12/1996 | Ohtani et al. |
| 5,620,905 A | | 4/1997 | Konuma et al. |

(List continued on next page.)

FOREIGN PATENT DOCUMENTS

| | | |
|---|---|---|
| CN | 1109211 | 9/1995 |
| CN | 1132409 | 10/1996 |
| EP | 0 656 644 | 6/1995 |
| JP | 2-61032 | 12/1990 |
| JP | 5-9794 | 2/1993 |
| JP | 6-244104 | 9/1994 |
| JP | 7-130652 | 5/1995 |
| JP | 7-135323 | 5/1995 |
| JP | 7-169974 | 7/1995 |
| JP | 7-335548 | 12/1995 |

*Primary Examiner*—John F. Niebling
*Assistant Examiner*—Stanetta Isaac
(74) *Attorney, Agent, or Firm*—Fish & Richardson P.C.

(57) ABSTRACT

A driver circuit integration type (monolithic type) active matrix display device having high performance is formed by using thin film transistors (TFT). While a nickel element is added t an amorphous silicon film 203, a head treatment is carried out to thereby crystallize the amorphous silicon film. Further, by carrying out a heat treatment in an oxidizing atmosphere containing a halogen element, a thermal oxidation film 209 is formed. At this time, cyrstallinity is improved and gettering of the nickel element proceeds. TFTs are formed by using the thus obtained crystalline silicon film, and various circuits are constituted by using the TFTs, so that a data driver circuit capable of driving the active matrix circuit having the dot number of fifty thousands to three millions can be obtained.

52 Claims, 10 Drawing Sheets

U.S. PATENT DOCUMENTS

| | | | |
|---|---|---|---|
| 5,643,826 A | | 7/1997 | Ohtani et al. |
| 5,677,212 A | * | 10/1997 | Misawa et al. ............. 438/153 |
| 5,744,824 A | * | 4/1998 | Kousai et al. ................. 257/74 |
| 5,789,763 A | * | 8/1998 | Kato et al. .................... 257/72 |
| 5,818,068 A | * | 10/1998 | Sasaki et al. ................. 257/59 |
| 5,821,137 A | * | 10/1998 | Wakai et al. ............... 438/163 |
| 5,858,823 A | * | 1/1999 | Yamazaki et al. .......... 438/166 |
| 5,869,362 A | | 2/1999 | Ohtani |
| 5,879,977 A | | 3/1999 | Zhang et al. |
| 5,940,690 A | * | 8/1999 | Kusumoto et al. .......... 438/149 |
| 5,956,579 A | * | 9/1999 | Yamazaki et al. .......... 438/151 |
| 5,985,741 A | * | 11/1999 | Yamazaki et al. .......... 438/166 |
| 6,028,326 A | * | 2/2000 | Uochi et al. ................... 257/66 |
| 6,049,092 A | | 4/2000 | Konuma et al. |
| 6,156,627 A | | 12/2000 | Zhang et al. |
| 6,162,667 A | * | 12/2000 | Funai et al. ................ 438/166 |

* cited by examiner

METHOD OF MANUFACTURING AN ACTIVE MATRIX DISPLAY

CROSS REFERENCE TO RELATED APPLICATIONS

This application is a divisional application of and claims the benefit of U.S. non-provisional application Ser. No. 08/987,870 filed Dec. 9, 1997 now abandoned and claims the benefit of foreign priority applications filed in Japan, serial number 8-344574, filed Dec. 9, 1996 and serial number 9-287715, filed Oct. 3, 1997.

BACKGROUND OF THE INVENTION

1. Field of the Invention

The present invention relates to an active matrix display device among electronic circuits constituted by using crystalline thin film semiconductors.

2. Description of the Related Art

Since a technique of manufacturing a thin film transistor (hereinafter referred to as TFT) by using an amorphous or crystalline semiconductor film formed on a glass substrate or a quartz substrate has been known, an attempt of applying this technique to an active matrix display circuit has been made. The simplest structure is such that only an active matrix circuit is constituted by the TFTs, and circuits for driving the active matrix circuit, such as a data driver (source driver) and a scan driver (gate driver), are constituted by integrated circuits using single crystal semiconductor.

However, this method requires a technique for connecting a large number of terminals between the active matrix circuit and the respective driver circuits, so that it is disadvantageous in enhancing the integration. On the other hand, there is a proposal in which a driver circuit is also constituted by TFTs in addition to an active matrix circuit (Japanese Patent Publication No. Hei 5-9794 and Japanese Patent Publication No. Hei 2-61032, etc.).

Like the above described structure, an active matrix display device in which a driver circuit and an active matrix circuit are formed on the same substrate is called a monolithic type active matrix display device. When the active matrix display device is the monolithic type, wiring lines required to be connected from the outside of the substrate are limited to those for only power supply, video signals, and synchronous signals, so that the monolithic type is advantageous in integration.

For driving a driver circuit, when using a silicon film as an active layer, a TFT is limited to those which include an active layer of crystalline silicon (polysilicon), and such a TFT is referred to as a high temperature polysilicon TFT or a low temperature polysilicon TFT according to process temperatures of a silicon film.

The high temperature polysilicon TFT is formed by a technique using a heat treatment at a relatively high temperature such as 800° C., 900° C. or more, as means for forming a crystalline silicon film. This technique may be called a derivative technique of IC manufacturing processes using a single crystal silicon wafer. As a substrate on which the high temperature polysilicon TFT is formed, a quartz substrate capable of withstanding the temperature at the heat treatment is naturally used.

On the other hand, the low temperature polysilicon TFT is formed by using an inexpensive glass substrate (its heat-resisting property is naturally inferior to the quartz substrate) as a substrate. In the production of a crystalline silicon film constituting the low temperature polysilicon TFT, there is used a heat treatment at a temperature of not higher than 600° C. against which the glass substrate is able to withstand, or a laser annealing technique which hardly gives thermal damage to the glass substrate.

The technique of manufacturing the high temperature polysilicon TFT has a feature that TFTs having uniform characteristics can be integrated on the substrate. On the other hand, the technique of manufacturing the low temperature polysilicon TFT has a feature that the glass substrate, which is inexpensive and is easily formed to have a large area, can be used as the substrate.

Incidentally, in the technique under the present circumstances, there is no large difference in characteristics between the high temperature polysilicon TFT and the low temperature polysilicon TFT. As a subtle difference, the high temperature polysilicon is superior in uniformity of the production yield and the characteristics in the surface of the substrate, and the low temperature polysilicon is superior in the productivity and the production cost.

In both of the high temperature and low temperature polysilicon TFTs, there have been obtained such characteristics that the mobility is about 50 to 100 (cm2/Vs), and S-value is about 200 to 400 (mV/dec)(VD=IV). The characteristics are such that it is possible to realize a high speed operation higher than a TFT using amorphous silicon by a factor of about double figures. However, the characteristics are largely inferior to those of a MOS transistor using a single crystal silicon wafer. In general, the S-value of the MOS transistor using the single crystal silicon wafer is about 60 to 70 (mV/dec), and the operation frequency thereof is higher than that of the high temperature polysilicon TFT or the low temperature polysilicon TFT by a factor of about single figure to double figures.

Since a data driver circuit using the high temperature or low temperature polysilicon TFT having such characteristics has the limit in signal processing capacity, it is necessary to make a specific design for constituting a large scale matrix. For example, if the matrix is a small scale matrix such that the number of pixels (the number of pixel electrodes of an active matrix circuit) is less than fifty thousands, the basic structure shown in FIGS. 1A and 1B is sufficient.

FIG. 1A shows an active matrix circuit 3, and a scan driver 2 and a data driver 1 for driving the active matrix circuit 3. The active matrix circuit 3 is connected to the scan driver 2 and the data driver 1 by a large number of wiring lines 5 and 4. Since these wiring lines are formed at the same time when the above circuits are formed, there is no difficulty in the production. A large number of pixels 6 are disposed in the active matrix circuit 3, and each of the pixels includes a switching transistor 7 and a pixel electrode 8. A plurality of switching transistors may be used (FIG. 1A).

FIG. 1B shows the details of the data driver circuit. That is, the data driver circuit has such a structure that in accordance with pulses sequentially generated from a shift register, a video signal is sampled by sampling transistors, and the signals are stored by analog memories (capacitors), and when sampling for all rows is ended, analog switches (and analog buffers) are concurrently driven by a latch pulse, and the signals are sent to the active matrix (FIG. 1B).

For example, if the number of pixels are less than fifty thousands, in order to process the picture image information of thirty frames per one second, the processing speed of the data driver is sufficient when it is fifty thousands (pixels)× thirty (frames/second )=1.5 MHz.

This is a speed which can be handled by the conventional high temperature or low temperature polysilicon TFT.

However, if the number of pixels is increased, TFTs cannot follow operation speed. A first method of solving this problem is to provide plural lines of shift registers. For example, two lines of shift registers are provided in parallel to each other, and the respective registers are made to transmit pulses the phases of which are shifted by half a period.

A second method is to provide plural lines of video signals. For example, four lines of video signals are provided, and these are sampled by one shift register, so that an operation speed can be reduced to ¼. An example will be explained with reference to FIG. 9. When a pulse is generated from a shift register of n-th stage, sampling is carried out by four sampling transistors connected to respective signal lines of video signals 1 to 4. The subsequent operation is the same as the case of FIG. 1B. In this way, since one stage of shift register can drive four columns of data lines, when the number of data lines is 4N, it is sufficient that the number of stages of the shift register is N. Thus, as compared with the case of FIG. 1B, the operation speed can be reduced to ¼ (FIG. 9).

In order to adopt such a system, it is necessary to divide the video signal to ¼. FIG. 10 shows such a circuit which is constituted by four stages of shift registers 1 to 4. A sampling transistor and an analog memory similar to the data driver circuit are disposed at the output of the respective shift register (FIG. 10).

At the timing when a pulse is generated from the shift register of each stage to the sampling transistor, sampling of the video signal is sequentially performed, and this sampled signal is stored in the analog memory. At the timing when the fourth sampling transistor briefly operates, all the four analog switches operate so that video signals 1 to 4 are outputted.

Of course, the operation of a one-fourth frequency division circuit is high, and this circuit can not be disposed on the same substrate as the active matrix circuit. Thus, as shown in FIG. 11, this circuit is formed at the outside of the substrate by using a single crystal semiconductor. Further, four vide o signal lines and a synchronous signal line (clock signal line)and the like are needed to be connected to the active matrix display device (FIG. 11).

It is often carried out that an operation speed is further decreased by combining the first method and the second method described above. For example, in a display device of VGA specification, there are 640 lines×480 lines×three original colors=921600 pixels. In order to drive the pixels in 30 frames/set, a high speed operation of 28 MHz is required. However, such a high speed operation can not be achieved by well known high temperature or low temperature polysilicon TFTs.

However, for example, as shown in FIG. 12, when a screen is divided into upper and lower screens, four-divided video signals are inputted into the respective data drivers provided for the upper an d lower screens, and two lines of shift registers are provided for the respective data drivers, the operation speed can be decreased to ¹⁄₁₆, that is, 1.7 MHz. However, a circuit for dividing the video signal to ¼, and a circuit for generating pulses inputted into the shift register, are required to have operation performance of 28 MHz. These circuits can not be realized by the TFTs, so that they are externally provided. Thus, at least eight video signal lines and two synchronous signal lines for supplying pulses to the respective shift registers are required (FIG. 12).

In addition, there is a problem that due to a minute discrepancy of timing of division or the like, stripe patterns appear on a screen. Further, it is conceived that an oscillation circuit, a D/A converter, an A/D converter, and a digital circuit for performing various kinds of picture image processing, other than the driver circuit, are integrated on the same substrate (for example, Japanese Patent Unexamined Publication No. Hei 7-135323). However, the above oscillation circuit, D/A converter, A/D converter, and digital circuit for performing various kinds of image processing, are needed to operate at a frequency further higher than that of the driver circuit. It is practically impossible to constitute those circuits by the high temperature polysilicon TFT or low temperature polysilicon TFT obtained by the technique under the present circumstances.

Summary of the Invention

An object of the present invention is therefore to provide an active matrix display device by using thin film transistors capable of constituting circuits required to realize the above-mentioned high speed operation (in general, an operation speed of more than several tens IMHz).

The present invention is characterized by comprising the following two structures in a monolithic active matrix display device using TFTs formed over a substrate having an insulating surface.

As the substrate having the insulating surface, a glass substrate (although it is required to have heat resistance against a process temperature, e.g. an alumina glass substrate), a quartz substrate, and a semiconductor substrate on the surface of which an insulating film is formed, are exemplified.

The first structure is that when the number of lines of shift register circuits constituting a data driver circuit is p, the number of video terminals inputted to the data driver circuit from the outside of the substrate is q, and the number of pixel electrodes existing in an active matrix circuit and driven by the data driver circuit is R, R/pq is from fifty thousands to three millions.

The second structure is that an active layer of a thin film transistor constituting the data driver circuit is a semiconductor film crystallized by a heat treatment under the existence of a catalytic element for promoting the crystallization.

As the catalytic element for promoting the crystallization of semiconductor, nickel is extremely preferable from the viewpoint of reproducibility and effect. As other catalytic elements, one kind or plural kinds of elements selected from the group consisting of Fe, Co, Ni, Ru, Rh, Pd, Os, Ir, Pt, Cu and Au may be used.

Methods of introducing a metal element include a method of coating a solution containing the metal element, a method of CVD, a method of sputtering or evaporation, a method of plasma treatment using an electrode containing the metal element, and a method of gas adsorption. Those methods are disclosed in, for example, Japanese Patent Unexamined Publication No. Hei 6-244104 (sputtering method), Hei 7-130652 (solution coating method), and Hei 7-335548 (CVD method).

The catalytic element may be introduced into the entire surface of a semiconductor film, or may be selectively introduced. If the latter method is adopted, the direction of crystal growth can be controlled. However, for the selective introduction, a step of forming a mask is required.

The temperature of heat treatment for crystallization is 450 to 750° C., preferably 550 to 650° C. An atmosphere at the crystallization is an inert gas atmosphere including oxygen as little as possible, such as a nitrogen atmosphere.

A manufacturing method of a crystalline semiconductor film constituting the active layer of the present invention is characterized by including a step of gettering the catalytic element in the crystalline semiconductor film by carrying out a second heat treatment so as to decrease the catalytic element in the crystalline semiconductor film after a step of crystallization by a first heating treatment, in addition to the above-mentioned two structures.

One means of gettering treatment is a method of performing gettering of the catalytic element in the crystallized semiconductor film by the operation of a halogen element through a heat treatment in an atmosphere including the halogen element. Other means is a method in which impurities in group 15 or in group 15 and group 13 are selectively added into the crystallized semiconductor film and a heat treatment is carried out, so that gettering of the catalytic element is carried out in the region where the impurities were added.

In the case where a gettering step of using a halogen element is adopted, it is preferable to carry out the above heat treatment at a temperature exceeding 700° C. At a temperature lower than 700° C., it becomes difficult to decompose a halogen compound in the processing atmosphere, so that there arises a fear that the gettering effect can not be obtained. Thus, the temperature of the heat treatment is made preferably 800 to 1000° C. (typically 950° C.), and a time of the treatment is made 0.1 to 6 hours, typically 0.5 to 1 hour.

A typical gettering step is a step of heat treatment at a temperature of 950° C. and for 30 minutes in an oxygen atmosphere containing hydrogen chloride (HCl) of 0.5 to 10 vol % (3 vol % in an embodiment). If the concentration of HCL is more than the above, roughness almost equal to a film thickness is formed on the surface of the crystalline semiconductor film so that it is not preferable. Further, it is also effective to introduce hydrogen gas into the atmosphere and to use the reaction of wet oxidation. As gases for adding a halogen element into an atmosphere, other than the HCl gas, one kind or plural kinds of gases selected from the group consisting of compound gases including the halogen element and halogen gases, such as HF, NF3, HBr, Cl2, ClF3, BCl3, F2 and Br2, may be used.

In the case where a nickel element is used as the catalytic element, the concentration of nickel finally remaining in the semiconductor film is about 1×1014 atoms/cm3 to 5×1018 atoms/cm3. The measurement of this concentration may be carried out by using SIMS (secondary ion measurement system).

When the atmosphere of gettering is made an oxidizing atmosphere such as oxygen or water vapor, the effect of gettering is promoted. When the atmosphere is made the oxidizing atmosphere, a thermal oxidation film is formed on the surface of the crystalline semiconductor thin film, and the catalytic element is concentrated in the thermal oxidation film. If the gettering condition of the thermal oxidation film is adjusted, the upper limit of this concentration can be decreased to about 5×1017 atoms/cm3. If the thickness of the thermal oxidation film is thicker than the semiconductor thin film, a TFT having superior characteristics can be obtained. Since the catalytic element in the semiconductor film is concentrated in the thermal oxidation film, the thermal oxidation film is preferably removed after the gettering step.

In order to improve the characteristics of the semiconductor device, after the thermal oxidation film was once removed, a heat treatment is again carried out under the same condition as the second heat treatment, so that a thermal oxidation film may be formed on the surface of the semiconductor film. It is needless to say that it is preferable to make the thickness of the thermal oxidation film obtained at that time thicker than the semiconductor film.

Since the catalytic metal element is converted into a halogen compound and is vaporized into the atmosphere by the heat treatment in the halogen atmosphere, a gradient or distribution of the nickel concentration occurs in the thickness direction of the obtained crystalline semiconductor film. In general, it is observed that the concentration of the metal element in the crystalline semiconductor film has a tendency that the concentration of the metal element increases toward the interface where the thermal oxidation film is formed. According to a condition, it is observed that the concentration of the metal element tends to increase toward the substrate or an under film, that is, toward the interface at the back side. The halogen element also has the concentration distribution similar to that of the metal element. That is, it exhibits the concentration distribution in which the concentration increases toward the top side surface and/or back side surface of the crystalline semiconductor film.

In the case where impurities in group 15 or in group 15 and group 13 are used as means of gettering, it is most suitable to use phosphorus among the impurity elements in group 15. As the impurities in group 13, boron is the most suitable, and antimony is suitable next to boron.

The heat temperature in this case is 400 to 1050° C., and preferably 600 to 650° C. By this heat treatment, the gettering of the catalytic element is performed in the region where the impurities in group 15 or in group 15 and group 13 has been added, and the concentration of catalytic element in other regions is lowered to less than 5×1017 atoms/cm3.

Through the above two gettering treatments, the lower limit of nickel concentration in the crystalline semiconductor film is generally about 1×1016 atoms/cm3. This is because in view of the cost, it is normally difficult to cancel the influence of nickel element attached to the substrate or the device so that such an amount of nickel element remains. That is, in the case where conventional manufacturing steps are adopted, the concentration of remaining nickel element is about 1×1016 atoms/cm3 to 5×1017 atoms/cm3. However, it is possible to decrease the concentration of the remaining element by optimizing the degree of cleansing of the device or manufacturing steps.

A gate insulating film of a thin film transistor of the data driver circuit of the present invention is characterized by including a thermal oxidation film formed by thermal oxidation of an active layer. The forming temperature of this thermal oxidation film is extremely important. In order to obtain such a TFT as is capable of making a single device operate at a speed of more than several tens MHz as described later and has an S-value of not larger than 100 (mV/dec), the heating temperature at the formation of the thermal oxidation film is needed to be preferably made 800° C. or more, and more preferably 900° C. or more. On the other hand, it is suitable that the upper limit of the heat temperature is made about 1100° C. which is the upper limit of heat-resisting temperature of the quartz substrate.

The final film thickness of the crystalline semiconductor film of the present invention is preferably 100 Å to 750 Å, more preferably 150 Å to 450 Å. By realizing such a film thickness, the crystalline structure as shown in FIGS. 6 to 8 can be obtained more prominently and with good reproducibility.

The final film thickness of the crystalline semiconductor film is needed to be determined by taking the decrease of film thickness due to film growth of the thermal oxidation film into consideration.

By adopting the above steps, the crystalline semiconductor film of the present invention can be obtained. Further, it is possible to obtain a TFT using the uniqueness of the crystalline structure. The thus obtained TFT can realize the above-mentioned first structure of the present invention. In the display device of the present invention, of course, as shown in FIGS. 11 and 12, division (frequency division) of a video signal or multiplication of lines of shift registers may be conducted. However, when considering that the present invention is applied to the active matrix display device of the most simple structure as shown in FIG. 1, it is desired that p=q=1 in the first structure.

DETAILED DESCRIPTION OF THE PREFERRED EMBODIMENTS

Preferred embodiments of the present invention will now be described with reference to the drawings.

These embodiments relate to a monolithic type active matrix device formed over a substrate having an insulating surface and including an active matrix circuit having pixel electrodes and a data driver circuit for driving the active matrix circuit.

Figure 1A:
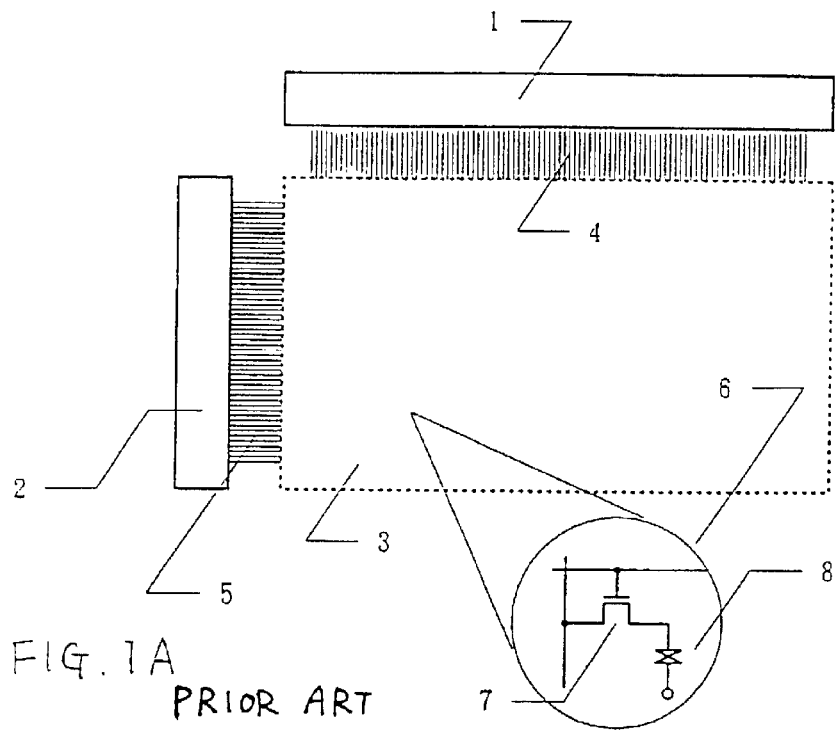
FIGS. 1A and 1B are views schematically showing an active matrix device of the present invention.
Figure 1B:
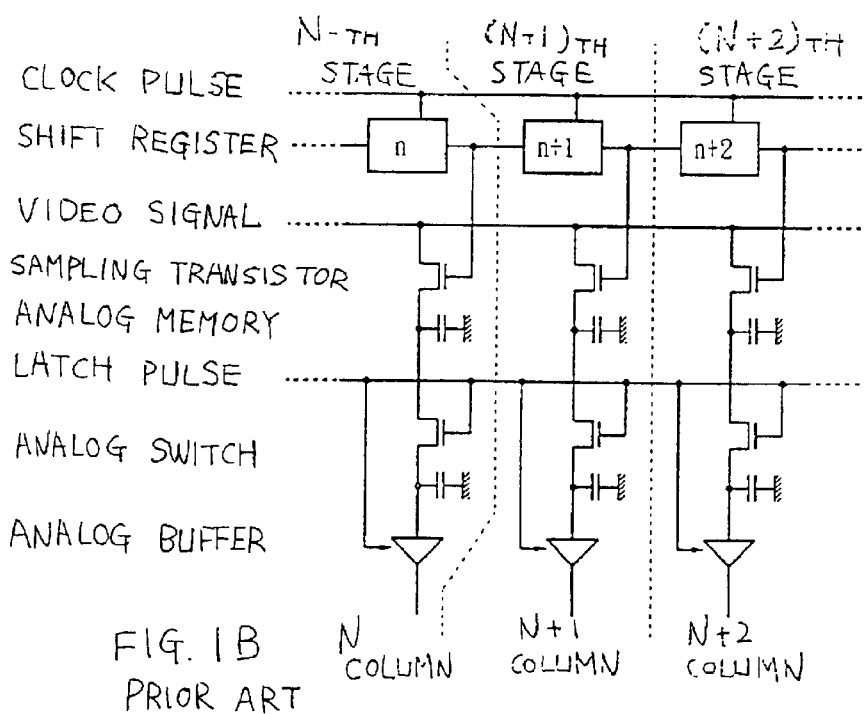

In the following embodiments, the structure and arrangement of an active matrix display device is not technically much different from a conventional one (for example, as shown in FIG. 1), so that a crystalline semiconductor film and manufacturing steps of a TFT will be mainly described.

Especially, there will be described manufacturing steps of TFTs suitably arranged in a data driver circuit for an active matrix circuit having a large number of pixels such that when the number of lines of shift registers constituting the data driver circuit is p, the number of video terminals inputted to the data driver circuit from the outside of a substrate is q, and the number of pixel electrodes existing in the active matrix circuit and driven by the data driver circuit is R, R/pq is from fifty thousands to three millions.

[First Embodiment]

In this embodiment, a method of nonselectively introducing a metal element, which promotes crystallization of silicon, into the entire surface of an amorphous silicon film, will be described, and steps of manufacturing a TFT using a crystalline silicon film will be described.

FIGS. 2A to 2D show manufacturing steps of this embodiment. First, a silicon oxide film with a thickness of 3000 Å is formed, as an under film 202, on a quartz substrate 201. If the smoothness of the surface of the quartz substrate 201 is good and cleansing is sufficiently carried out, this under layer 202 is not necessarily needed.

As the substrate, in the current circumstances, it is preferable selection to use the quartz substrate. However, as long as a substrate can withstand the temperature of heat treatment, the substrate is not limited to quartz. For example, it is also possible to use a semiconductor substrate with a surface on which an oxidation film is formed. Also, an alumina glass substrate may be used.

Next, an amorphous silicon film 203 with a thickness of 500 Å, as a starting film of a crystalline silicon film, is formed by a low pressure CVD method.

Figure 2A:
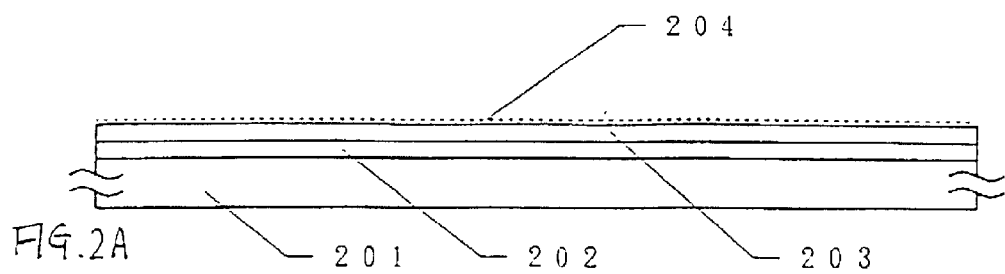
FIGS. 2A to 2D are views showing manufacturing steps of a thin film transistor of a first embodiment.

Then, a nickel acetate solution containing a nickel element of 10 ppm in weight is provided on the film 203. A superfluous solution is removed by spin dry using a not-shown spinner. Detailed conditions used in this embodiment are disclosed in Japanese Patent Unexamined Publication No. Hei 7-130652. In this way, the state in which the nickel element exists in the state as shown by a dotted line 204 in FIG. 2A is obtained. The above method of using the solution is superior, as a method of introducing nickel, in view of the control of the amount of introduction and reproducibility. However, the method of introducing nickel is not limited to the above method. The catalytic element for promoting the crystallization of silicon, such as nickel, may be introduced by using a CVD method, a sputtering method, an evaporation method, a plasma treatment, a gas adsorption method, and the like.

Figure 2B:
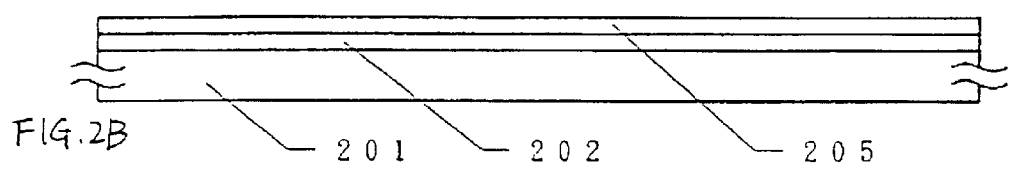

Next, in a nitrogen atmosphere containing hydrogen of 3% and containing oxygen as little as possible, a heat treatment at 600° C. for eight hours (first heat treatment)is carried out. By this heat treatment, crystallization proceeds so that a crystalline silicon film 205 as shown in FIG. 2B is obtained. The heat treatment for crystal growth is preferably carried out at a temperature from 450° C. to 750° C. However, even if the temperature is raised any more, the crystallinity is not improved so much, rather it is deteriorated.

After the crystallization by the first heat treatment, laser beam irradiation may be carried out. That is, by the irradiation of laser beam, crystallization may be further promoted. The irradiation of laser beam has an effect to disperse the agglomeration of nickel element existing in the film so that the nickel element is easily removed later. As the laser beam, an excimer laser having a wavelength of ultraviolet region may be used. For example, a KrF excimer laser (wavelength 248 nm)or a XeCl excimer laser (wavelength 308 nm) may be used.

Figure 2C:
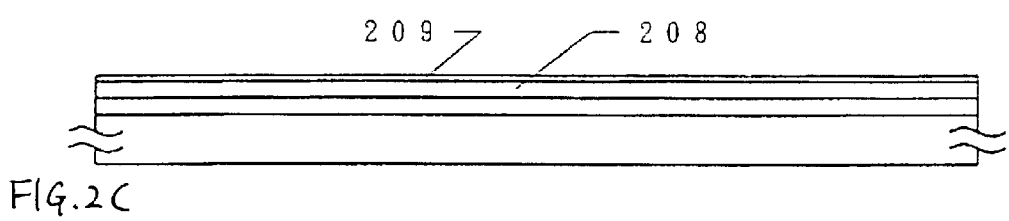

After the heat treatment for crystallization is ended, a heat treatment (second heat treatment) at 950° C. in an oxygen atmosphere containing HCl of 3 vol % is carried out. In this step, a thermal oxidation film 209 with a thickness of 200 Å is formed on the surface of the crystalline silicon film 205. In accordance with the formation of the thermal oxidation film, the film thickness of the crystalline silicon film 208 is decreased by about 100 Å. That is, the film thickness of the silicon film 208 becomes about 400 Å (FIG. 2C).

In this step, in accordance with the format ion of the thermal oxidation film 209, the silicon element having an unstable bonding state in the silicon film 208 is used for forming the thermal oxidation film 209. The defects in the silicon film 208 decrease and crystallinity of higher quality can be obtained. At the same time, by the formation of the thermal oxidation film and operation of chlorine, gettering of the nickel element from the film is carried out.

Of course, the nickel element of relatively high concentration is taken into the thermal oxidation film 209 formed in this step. The concentration of nickel element in the silicon film 208 is relatively decreased. After the thermal oxidation film 209 is formed, the thermal oxidation film 209 is removed. In this way, the crystalline silicon film 208 in which the concentration of nickel element is decreased, is obtained (FIG. 2D).

Figure 2D:
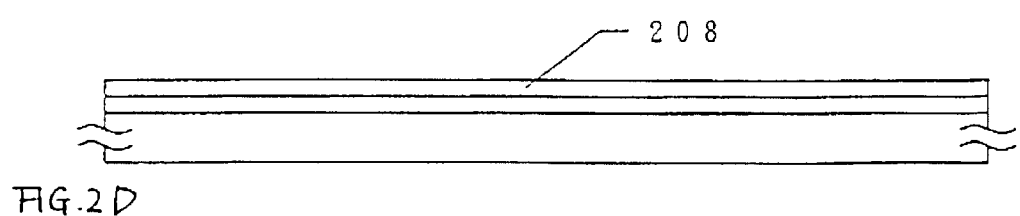
Figure 3A:
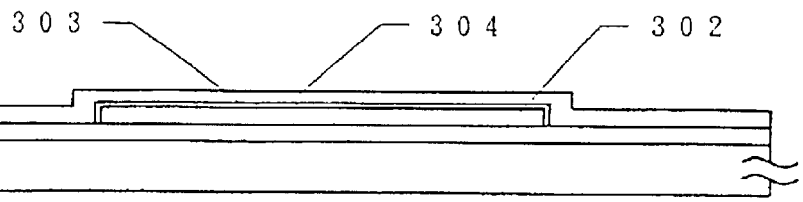
FIGS. 3A to 3E are views showing the manufacturing steps of the thin film transistor of the first embodiment.

After the removal of the thermal oxidation film 209 is completed and the crystalline silicon film 208 as shown in FIG. 2D is obtained, etching of the silicon film is carried out to form an island region 302. This island region becomes an active layer of a TFT later. Then, as shown in FIG. 3A, after forming the pattern 302, a silicon oxide film 304 with a thickness of 1000 Å is formed by a plasma CVD method. This silicon oxide film 304 functions as a gate insulating film later.

After the silicon oxide film 304 is formed, a heat treatment (third heat treatment) at 950° C. is carried out in an oxygen atmosphere containing HCL of 3%, so that a thermal oxidation film 303 with a thickness of 300 Å is formed. This thermal oxidation film 303 is formed between the active layer 302 and the CVD oxidation film 304 as shown in FIG. 3A. By forming the thermal oxidation film 303, the film thickness of the pattern 302 as the active layer becomes 250 Å.

In order to obtain a TFT having higher performance, it is preferable to make the film thickness of the thermal oxidation film 303 thicker than that of the crystalline silicon film constituting the active layer. In general, it is an important condition to make the film thickness of the sum of the thermal oxidation film 209 and the thermal oxidation film 303 thicker than that of the finally obtained active layer. The thermal oxidation film 303 constitutes a part of the gate insulating film. In this way, the state as shown in FIG. 3A is obtained.

Next, an aluminum film with a thickness of 4000 Å for forming a gate electrode is formed by a sputtering method. Scandium of 0.2 wt % is made to be contained in this aluminum film. The reason why scandium is contained in the aluminum film is to suppress the occurrence of hillocks and whiskers in a subsequent step. The hillocks and whiskers are needle-like protrusions caused by abnormal growth of aluminum at heating.

After the aluminum film is formed, a not-shown dense anodic oxidation film is formed. This anodic oxidation film is formed by anodic oxidation using an ethylene glycol solution containing tartaric acid of 3% as an electrolytic solution, the aluminum film as an anode, and platinum as a cathode. In this step, the anodic oxidation film with a thickness of 100 Å and having dense film quality is formed on the aluminum film. This not-shown anodic oxidation film functions to improve adhesiveness to a resist mask formed later. The film thickness of the anodic oxidation film can be controlled by an applied voltage at the anodic oxidation.

Figure 3B:
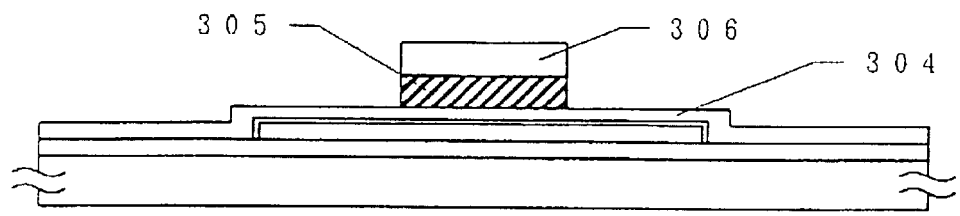

Next, a resist mask 306 is formed. By using this resist mask, the aluminum film is patterned into a pattern 305. In this way, the state as shown in FIG. 3B is obtained.

Here, anodic oxidation is again carried out. In this embodiment, an aqueous solution of oxalic acid of 3% is used as an electrolytic solution. In this electrolytic solution, anodic-oxidation using the aluminum pattern 305 as an anode is carried out, so that a porous anodic oxidation film 308 is formed. In this step, since the resist mask 306 having high adhesiveness exists at the upper portion, the anodic oxidation film 308 is selectively formed on the side of the aluminum pattern. This anodic oxidation film can be formed to have a film thickness of several μm. Here, the film thickness is made 6000 Å. The growth distance can be controlled by an anodic oxidation time.

Then, the resist mask 306 is removed. Next, a dense anodic oxidation film is again formed. That is, anodic oxidation using the ethylene glycol solution containing tartaric acid of 3% as an electrolytic solution is again carried out. In this step, since the electrolytic solution permeates into the porous anodic oxidation film 308, an anodic oxidation film having dense film quality as indicated by 309 is formed. The film thickness of the dense anodic oxidation film 309 is made 1000 å Å. The control of the film thickness is carried out by an applied voltage.

Figure 3C:
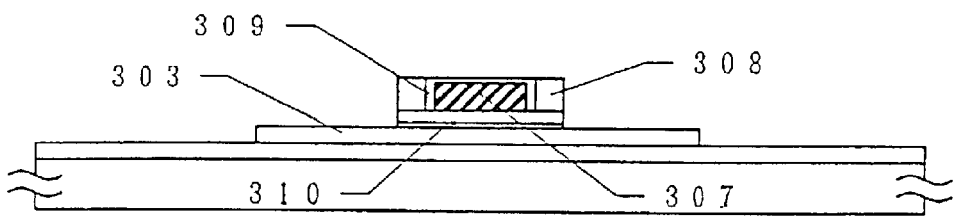

Next, the exposed silicon oxide film 304 is removed by etching. At the same time, the thermal oxidation film 303 is etched. This etching is carried out by using, as a mask, the anodic oxidation film obtained in the above step and using dry etching. Here, a film 310 is a remaining film of the silicon oxide film formed by the CVD method. The thermal oxidation film having the similar shape to the former film remains under the remaining silicon oxide film. In this way, the structure as shown in FIG. 3C is obtained. Incidentally, a technique of forming a gate electrode of complicated shape by using the above anodic oxidation method is disclosed in Japanese Patent Unexamined Publication No. Hei 7-169974.

The porous anodic oxidation film 308 is removed by using a mixed acid of acetic acid, nitric acid and phosphoric acid.

Next, impurity ions are implanted. Here, in order to fabricate an N-channel thin film transistor, P (phosphorus) ion implantation is carried out by a plasma doping method.

In this step, there are formed heavily doped regions 311 and 315, and lightly doped regions 312 and 314. This is because the remaining silicon oxide film 310 functions as a semitransparent mask, so that a part of the implanted ions is blocked by the film. This step is also disclosed in Japanese Patent Unexamined Publication No. Hei 7-169974. The doping step may be divided into a high dose doping step of a low energy and a low dose doping step of a high energy. Also in this case, by the silicon oxide film 310, doping is carried out to a selective depth, and as a result, two kinds of regions can be obtained.

By carrying out the irradiation of laser beam (or intense light using a lamp), activation of the region where the impurity ions have been implanted is carried out. In this way, a source region 311, a channel formation region 313, a drain region 315, and low concentration impurity regions 312 and 314 are formed, in a self aligning manner. Here, the region indicated by 314 is a region called an LDD (lightly doped drain) region (FIG. 3D).

In the case where the film thickness of the dense anodic oxidation film 309 is made thick, for example, more than 2000 Å, an offset gate region can be formed at the outside of the channel formation region 313 by the film thickness. Also in this embodiment, the offset gate region is formed. However, the dimension thereof is small so that the contribution due to its existence is small. Further, depiction of the offset gate region complicates the drawing. Thus, the offset gate region is not shown in the drawings.

In order to thickly form the anodic oxidation film with the dense film quality so as to have such a thickness of 2000 Å or more, an applied voltage exceeding 200V is required, so that attention must be paid for reproducibility and safety.

Figure 3D:
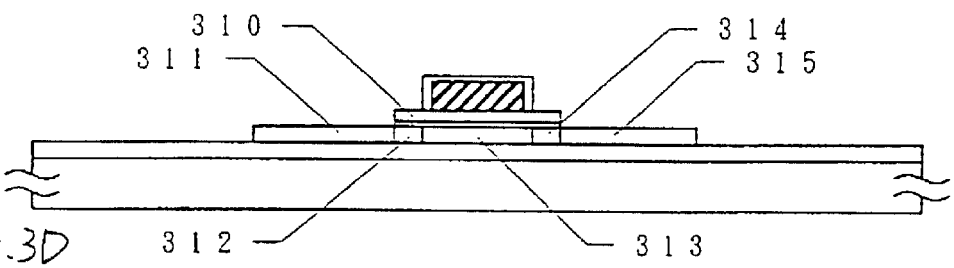
Figure 3E:
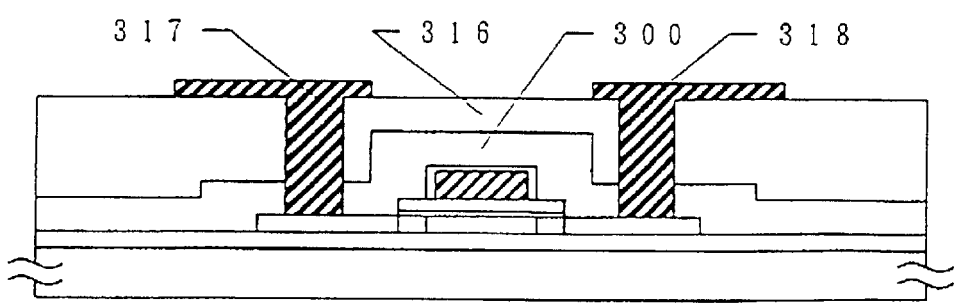

After the state as shown in FIG. 3D is obtained, a silicon nitride film 300 as an interlayer insulating film is formed by a plasma CVD method, and a polyimide resin film 316 is formed by using a spin coating method. Then, contact holes are formed, and a source electrode 317 and a drain electrode 318 are formed. In this way, a TFT as shown in FIG. 3E is completed.

The TFT shown in this embodiment has very high performance which has not been conventionally obtained. For example, in an NTFT (N-channel TFT), there is obtained such high performance that the mobility is 200 to 300 (cm$^2$/Vs)and S-value is 75 t0 90 (mV/dec)($V_D$=1V). In a PTFT (P-channel TFT), there is obtained such high performance that the mobility is 120 to 180 (cm$^2$/Vs) and S-value is 75 to 100 (mV/dec)($V_D$=1V). Especially, the S-value is such a marvelously superior value as less than half of a value of a conventional high temperature polysilicon TFT or a low temperature polysilicon TFT. An OP amplifier, a memory circuit, various extended circuits, and an amplifier can be formed by using such a TFT.

[Second Embodiment]

This embodiment relates to a method in which a catalytic element for promoting crystallization of silicon is selectively introduced into an amorphous silicon film, so that crystal growth in the direction parallel to a substrate, called lateral growth, is carried out. FIGS. 4A to 4D show manufacturing steps of this embodiment.

First, a silicon oxide film with a thickness of 3000 Å as an under layer 402 is formed on a quartz substrate 401. Next, an amorphous silicon film 403 with a thickness of 500 Å, as a starting film of a crystalline silicon film, is formed by a low pressure thermal CVD method.

Next, a silicon oxide film with a thickness of 1500 Å is formed, and a mask 404 is formed by etching the silicon oxide film. This mask is provided with an opening at a region 405. In the region where the opening 405 is formed, the amorphous silicon film 403 is exposed.

The opening 405 is a slender rectangle having a longitudinal direction toward the depth from this side of the drawing. It is suitable to make the width of the opening 405 not less than 40 μm. The length in the longitudinal direction is made a required length.

Figure 4A:
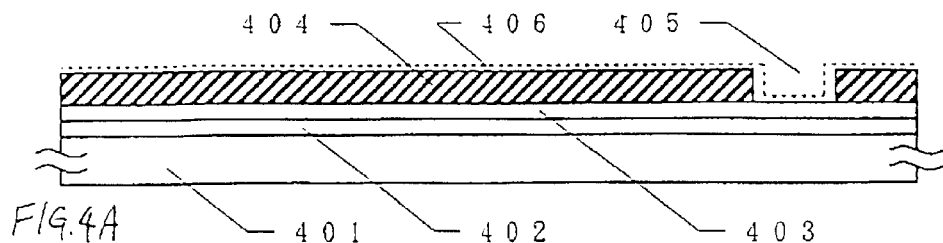
FIGS. 4A to 4D are views showing manufacturing steps of a thin film transistor of a second embodiment.

A nickel acetate solution containing a nickel element of 10 ppm in weight is coated. Similarly to the first embodiment, spin dry is carried out using a spinner to remove a superfluous solution. The amount of introduced nickel element can be controlled by the concentration of contained nickel element in the solution. In this way, the state in which the nickel element exists in the state shown by a dotted line 406 in FIG. 4A is obtained.

In this state, there is obtained a state in which the nickel element is selectively brought into contact with a part of the amorphous silicon film and is held at the bottom of the opening 405.

Figure 7A:
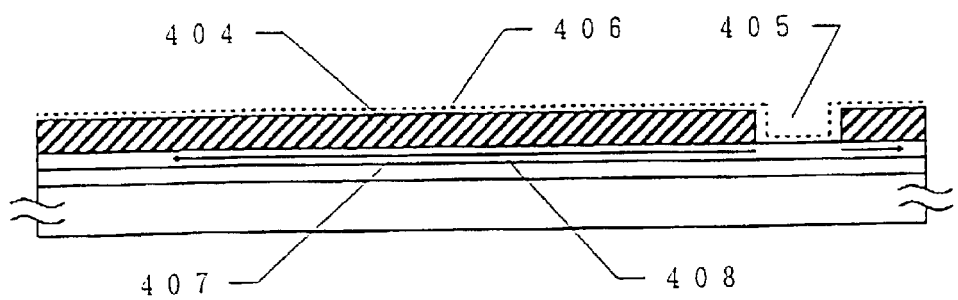
FIGS. 7A and 7B are views showing the state of crystal growth of the second embodiment.
Figure 7B:
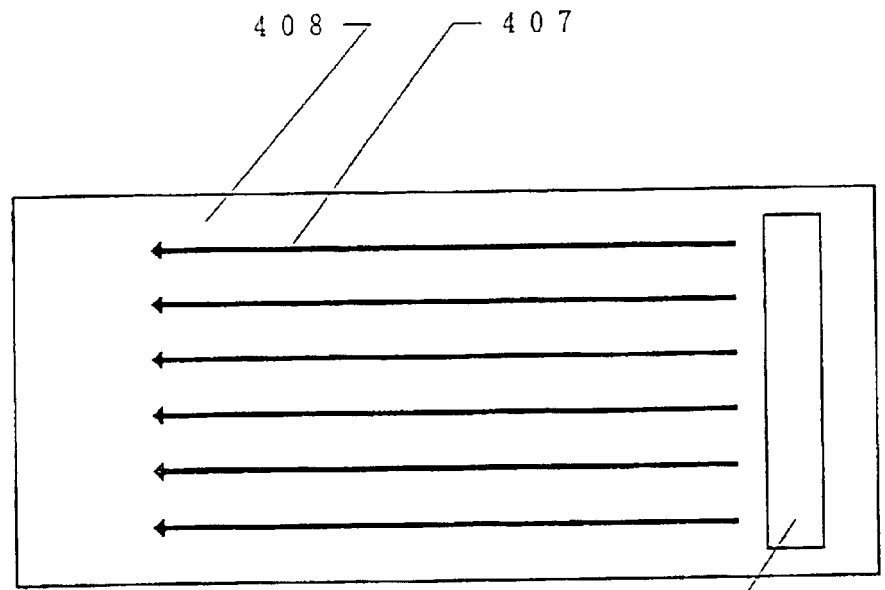

Next, in a nitrogen atmosphere containing hydrogen of 3% and oxygen as little as possible (or in a nitrogen atmosphere), a heat treatment at 600° C. for 8 hours is carried out. Then, crystal growth parallel to the substrate 401 as indicated by 407 in FIG. 4B proceeds. FIG. 7B schematically shows the state of the crystal growth seen from the above.

This crystal growth proceeds from the region of the opening 405 in which the nickel element has been introduced, toward the circumference. The crystal growth in the direction parallel to the substrate is called horizontal growth or lateral growth.

The surface of the crystalline silicon film of lateral growth obtained by this crystal growth has very superior smoothness as compared with the conventional low temperature polysilicon or high temperature polysilicon. It is conceivable that this smoothness is obtained since the directions of extension of crystal grain boundaries are almost aligned.

The roughness of the surface of a silicon film of general polycrystalline silicon or polysilicon is not less than ±100 Å. However, it is observed that in the case of the lateral growth as shown in this embodiment, the roughness of the surface is not larger than ±30 Å. The roughness deteriorates the characteristics of an interface between the silicon film and gate insulating film, so that it is preferable that the roughness is as small as possible.

In the above condition of the heat treatment for crystallization, this lateral growth can be made over 100 μm or more. In this way, a silicon film 408 having the lateral growth region is obtained.

The heat treatment for crystal growth is carried out at a temperature from 450° C. to 750° C., similarly to the first embodiment. In order to assure some degree of lateral growth distance, it is preferable that the temperature of heat treatment is not lower than 600° C. However, even if the temperature is raised any more, the improvement in the crystal growth distance and crystallinity does not become so high. Rather, it is observed that the crystallinity is lowered. Accordingly, from the viewpoint of cost and simplification of steps, a heat treatment at a temperature of 600° C. to 650° C. is sufficient.

Next, the mask 404 made of a silicon oxide film for selectively introducing the nickel element is removed. In this state, the nickel element is unevenly distributed in the film. Especially, the nickel element of a relatively high concentration exists at the region where the opening 405 was formed and at the leading end portion 407 of crystal growth.

Accordingly, it is important to avoid such regions at the formation of the active layer. That is, it is important so that the region where the nickel element is unevenly distributed does not exist in the active layer. After crystallization, laser beam irradiation may be carried out so that the crystallization is further promoted. The irradiation of laser beam has an effect that the agglomeration of the nickel element existing in the film is dispersed so that the subsequent removal of the nickel element is made easy. However, the lateral growth does not proceed further.

Figure 4B:
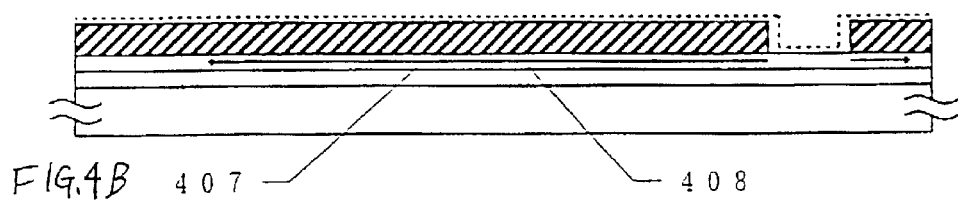
Figure 4C:
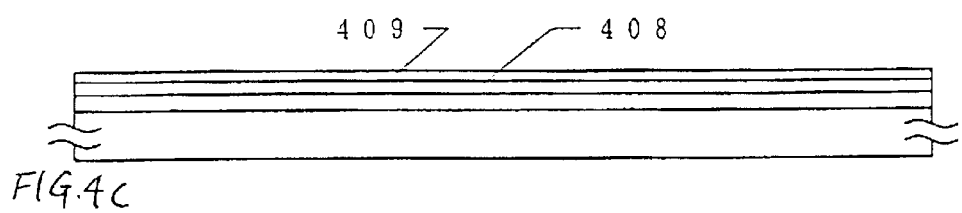
Figure 4D:
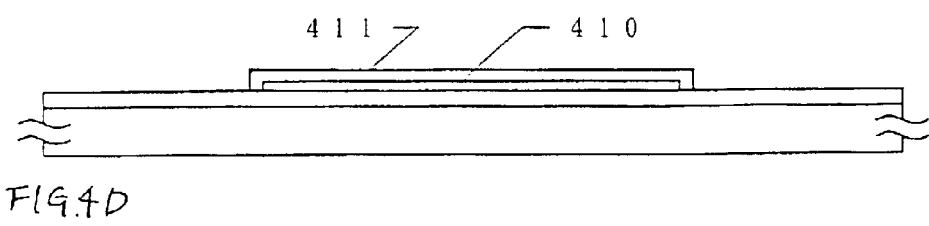

Next, a heat treatment is carried out at 950° C. in an oxygen atmosphere containing HCL of 3%, so that a thermal oxidation film 409 with a thickness of 200 Å is formed. In accordance with the formation of the thermal oxidation film, the film thickness of the silicon film 408 is decreased by about 100 Å. That is, the film thickness of the silicon film becomes about 400 Å (FIG. 4C).

In general, in a thermal oxidation film formed on the surface of a silicon film, the thickness of rising portion on the surface is almost equal to the distance of oxidation proceeding into the inside. Thus, for example, when a thermal oxidation film of 100 Å is formed on the surface of a silicon film of 100 Å, the thickness of the silicon film is decreased by 50 Å, so that such a structure is formed that the thermal oxidation film 100 Å thick is formed on the silicon film 50 Å thick.

In the above step, in accordance with the formation of the thermal oxidation film, a silicon element having an unstable bonding state in the film is used for the formation of the thermal oxidation film. Thus, defects in the film are decreased and higher crystallinity can be obtained. Further, at the same time, by the formation of the thermal oxidation film and operation of chlorine, the gettering of the nickel element is carried out in the silicon film 408. Of course, the nickel element of relatively high concentration is taken into the thermal oxidation film 409. The nickel element in the silicon film is decreased relatively (FIG. 4C).

After the thermal oxidation film 409 is formed, the thermal oxidation film 409 is removed. In this way, the crystalline silicon film 408 in which the concentration of nickel element is decreased, is obtained. The thus obtained crystalline silicon film 408 is constructed such that crystal structure extends in one direction (this direction is consistent with the direction of crystal growth) as shown in FIG. 7B. That is, the crystalline silicon film has such structure that slender column-like crystal bodies exist side by side in parallel with each other through a plurality of crystal grain boundaries extending in one direction.

Next, the silicon film is etched so that a pattern 410 of lateral growth region is formed. This island region 410 subsequently becomes an active layer of a TFT. In this embodiment, the pattern is positioned so that a direction connecting a source region to a drain region is coincident or substantially coincident with the direction of crystal growth. By this, the direction in which carriers move, can be made coincident with the direction in which crystal lattices continuously extend. As a result, a high performance TFT can be obtained.

After the pattern 410 is formed, a thermal oxidation film 411 with a thickness of 500 Å is formed. The thermal oxidation film 411 is obtained by a heat treatment at 950° C. in an oxygen atmosphere containing HCL of 3%. By forming the thermal-oxidation film 411, the film thickness of the pattern (pattern to become an active layer) becomes 250 Å.

Also in this case, it is possible to obtain the effect similar to the case of forming the thermal oxidation film 409. Incidentally, the thermal oxidation film 411 becomes a part of a gate insulating film of a TFT.

In this embodiment, the film thickness (250 Å) of the active layer 410 made of the finally obtained crystalline silicon film 408 is thinner than the film thickness (500 Å) of the second thermal oxidation film 411. This brings an effect to obtain the unique crystal structure as shown in FIGS. 6 and 7 in accordance with the formation of a thermal oxidation film.

Figure 5A:
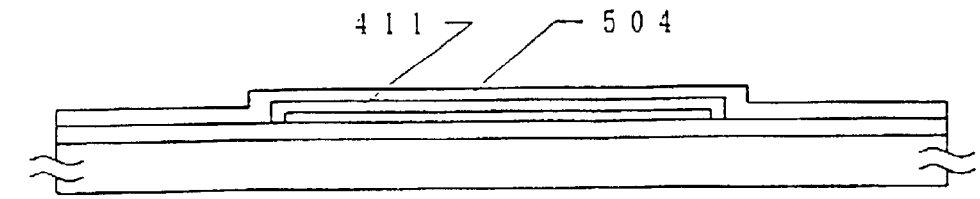
FIGS. 5A to 5E are views showing the manufacturing steps of the thin film transistor of the second embodiment.

Thereafter, a silicon oxide film 504 with a thickness of 1000 Å, which, together with the thermal oxidation film 411, constitutes a gate insulating film, is formed by a plasma CVD method (FIG. 5A).

Next, an aluminum film with a thickness of 4000 Å for forming a gate electrode is formed by a sputtering method. Scandium of 0.2 wt % is made contained in the aluminum film. After the aluminum film is formed, a not-shown dense anodic oxidation film with a thickness of 100 Å is formed.

Figure 5B:
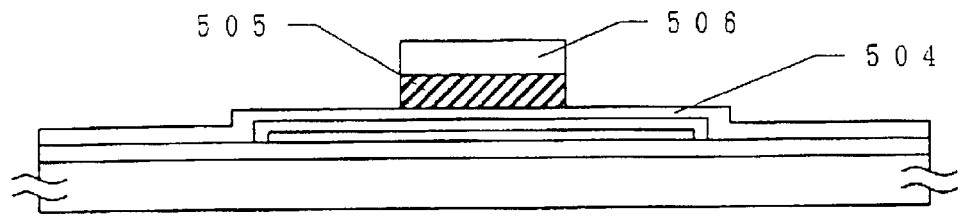

Next, a resist mask 506 is formed. By using this resist mask, the aluminum film is patterned into a pattern 505. In this way, the state as shown in FIG. 5B is obtained.

Figure 5C:
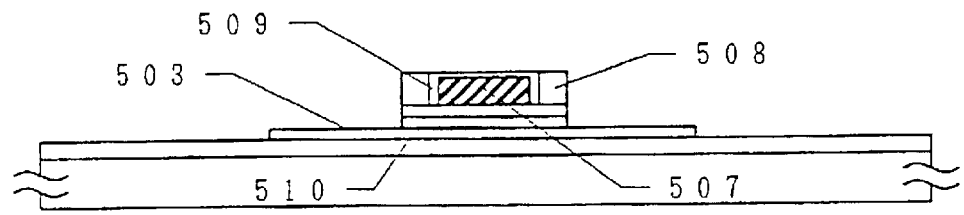

Here, anodic oxidation is again carried out. Similarly to the first embodiment, a porous anodic oxidation film 508 and a dense anodic oxidation film 509 are obtained. The thickness of the dense anodic oxidation film 509 is made 1000 Å. The exposed silicon oxide film 504 and the thermal oxidation film 411 are etched by using the anodic oxidation film as a mask, so that a gate insulating film 510 is newly obtained (FIG. 5C).

Figure 5D:
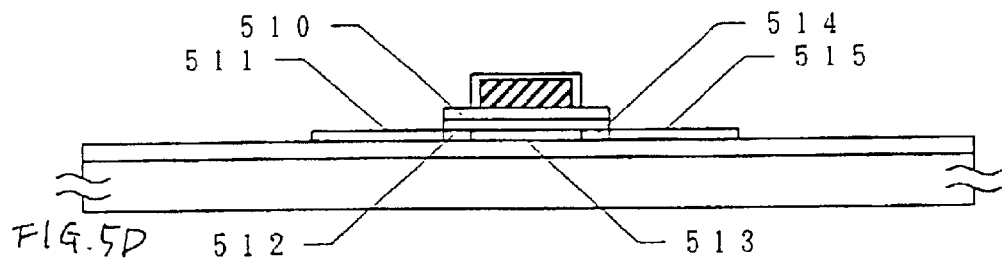

Next, the porous anodic oxidation film 508 is removed. In the same way as the first embodiment, implantation and activation of impurity ions are carried out. Here, implantation of P (phosphorus) ions to fabricate an N-channel thin film transistor is carried out by a plasma doping method. In this way, a source region 511, a channel formation region 513, a drain region 515, and low concentration impurity regions 512 and 514 are formed in a self aligning manner (FIG. 5D).

Figure 5E:
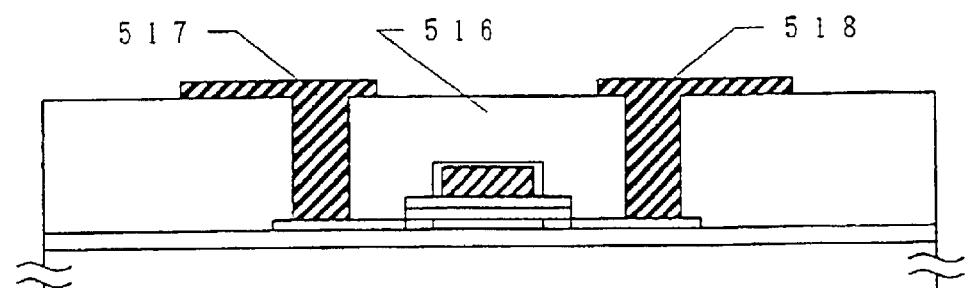

Next, a silicon oxide film, a silicon nitride film, or a laminated film thereof is formed as an interlayer insulating film 516. As the interlayer insulating film, a layer made of a resin material may be used on the silicon oxide film or silicon nitride film. Then, contact holes are formed, and a source electrode 517 and a drain electrode 518 are formed. In this way, the thin film transistor as shown in FIG. 5E is completed.

The TFT obtained in this embodiment has extremely high characteristics which could not be obtained in a conventional TFT. For example, in an NTFT (N-channel TFT), there is obtained such high performance that the mobility is 200 to 500 (cm$^2$/Vs), and S-value is 75 to 90 (mV/dec)($V_D$=1V). In a PTFT (P-channel TFT), there is obtained such high performance that the mobility is 120 to 180 (cm$^2$/Vs), and S-value is 75 to 100 (mV/dec)($V_D$=1V).

[Third Embodiment]

This embodiment relates to an example in which a method of forming a gate insulating film is devised in the structure shown in the second embodiment. FIGS. 6A to 6D show manufacturing steps of this embodiment. First, a crystalline silicon film 408 having a lateral growth region is obtained in accordance with the steps as shown in FIGS. 4A and 4B. In this embodiment, the thickness of an amorphous silicon film as a starting film is made 500 Å.

Figure 6A:
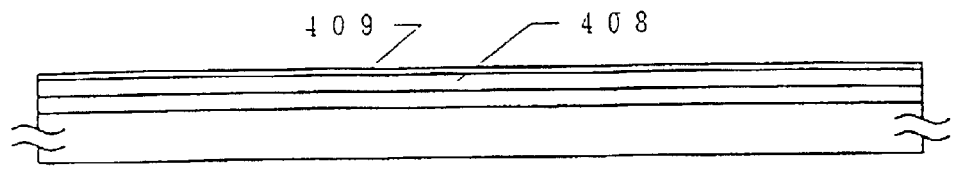
FIGS. 6A to 6D are views showing manufacturing steps of a thin film transistor of a third embodiment.

After the crystalline silicon film 408 is obtained, a heat treatment is carried out at a temperature of 950° C. in an oxygen atmosphere containing HCL of 3%, so that a thermal oxidation film 409 with a thickness of 200 Å is formed (FIG. 6A).

Figure 6B:
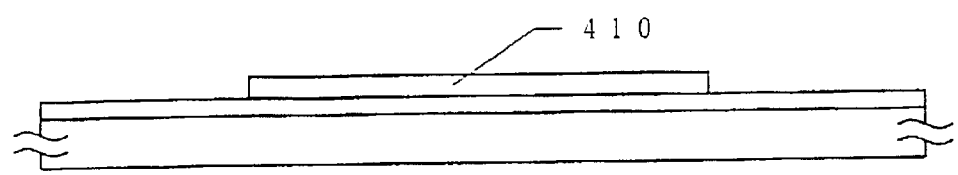

Next, the thermal oxidation film 409 is removed. Then, a pattern 410, which subsequently becomes an active layer of a thin film transistor, is formed by etching the silicon film (FIG. 6B).

Figure 6C:
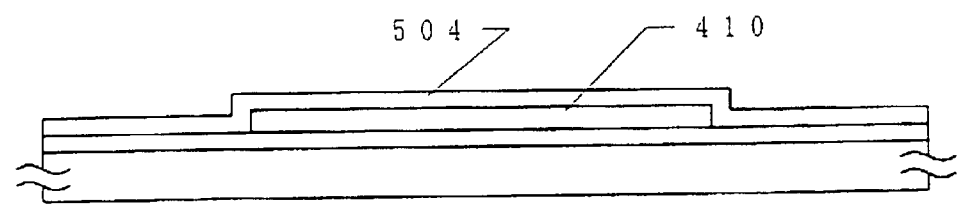

Next, an insulating film 504 is formed by a plasma CVD method. As the CVD insulating film 504, a silicon oxide film or a silicon nitride oxide film 504 with a thickness of 500 to 1500 Å is formed. In this embodiment, a silicon nitride oxide film with a thickness of 1000 Å is formed (FIG. 6C).

Figure 6D:
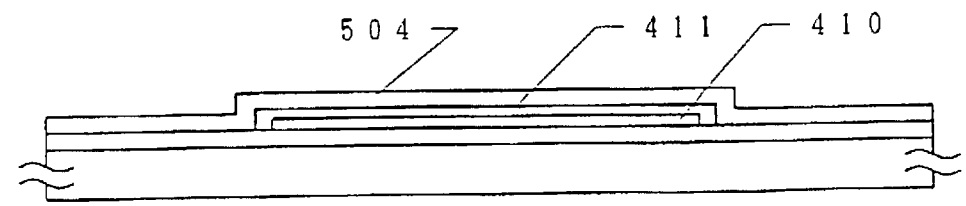

Next, a heat treatment is carried out at a temperature of 950° C. in an oxygen atmosphere containing HCL of 3%, so that a thermal oxidation film 411 with a thickness of 300 Å is formed. At this time, the thermal oxidation film 411 grows inside of the CVD oxidation film 504, and is formed in the state as shown in FIG. 6D.

In the case where the manufacturing steps shown in this embodiment are adopted, the gate insulating film is formed of a laminated film of the thermal oxidation film 411 and the CVD oxidation film 504. In the case where the manufacturing steps of this embodiment are adopted, the density of interfacial levels at the interface between the gate insulating film and the active layer can be made lower.

[Fourth Embodiment]

The first and second embodiments show the step in which gettering of a catalytic element for promoting crystallization of silicon is carried out by a halogen element. In this embodiment, an example in which a phosphorus element is used in a gettering step of catalytic element, will be described.

Figure 8A:
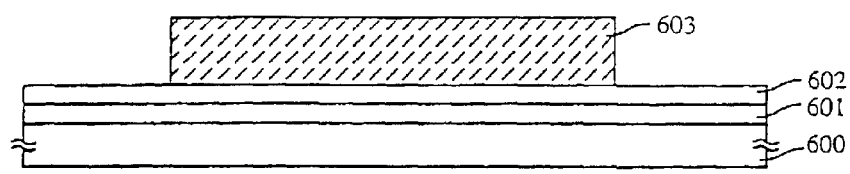
FIGS. 8A to 8E are views showing manufacturing steps of a thin film transistor of a fourth embodiment.

First, in accordance with the method described in the first or second embodiment, an amorphous silicon film on a quartz substrate 600 is crystallized to form a crystalline silicon film 602. Reference numeral 601 designates an under film made of a silicon oxide film. In this embodiment, the thickness of the amorphous silicon film is made 400 Å. A resist mask covering at least a region which becomes an active layer of a thin film transistor, is formed (FIG. 8A).

Figure 8B:
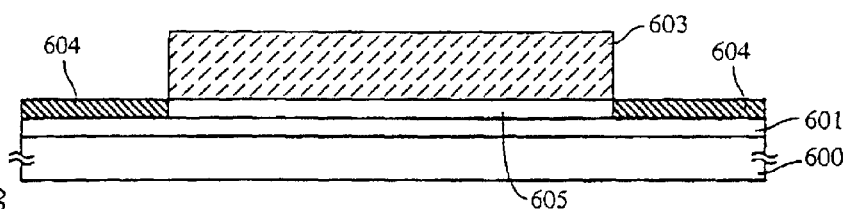

Next, as shown in FIG. 8B, phosphorus is added into regions other than a region which becomes an active layer, so that a gettering region 604 is formed. Methods of adding phosphorus include a vapor phase method such as an ion doping method, a liquid phase method such as a spin coating method, a sputtering method of a film containing phosphorus, and a solid phase method using a CVD method. The region where phosphorus has not been added, is called a gettered region 605.

Figure 8C:
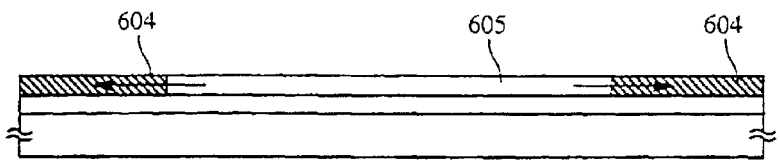

As shown in FIG. 8C, after the resist mask 603 is removed, a heat treatment at a temperature of 400 to 1050° C., preferably 600 to 750° C. for 1 min to 20 hr (typically 30 min to 3 hr) is carried out. By this heat treatment, the catalytic element is diffused into the gettering region 604, and is captured by phosphorus, so that the concentration of the catalytic element in the gettered region 605 is decreased to $5 \times 10^{17}$ atoms/cm$^3$ or less.

Figure 8D:
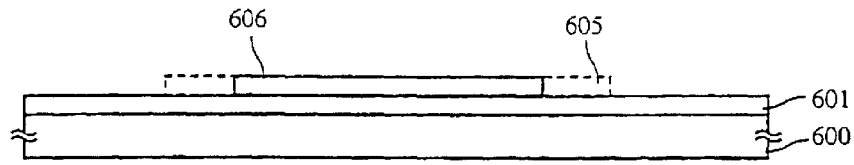
Figure 8E:
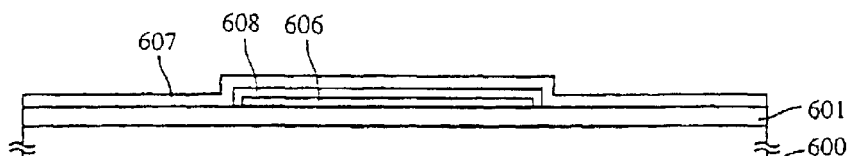
Figure 9:
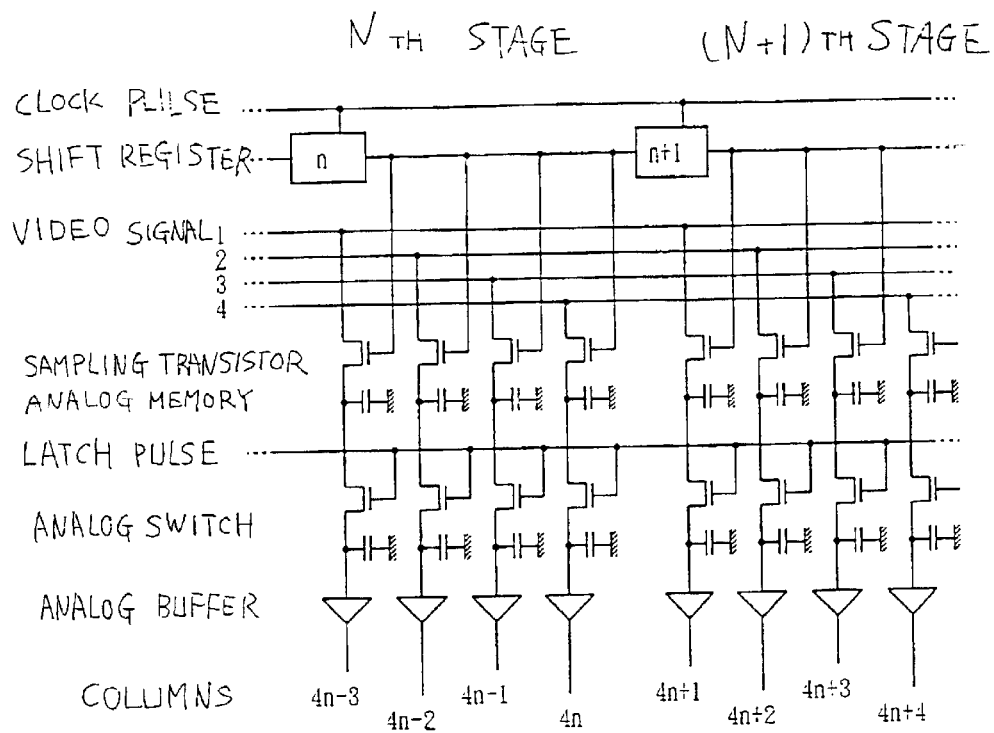
FIG. 9 is a view schematically showing a conventional driver circuit according to a video signal division method.
Figure 10:
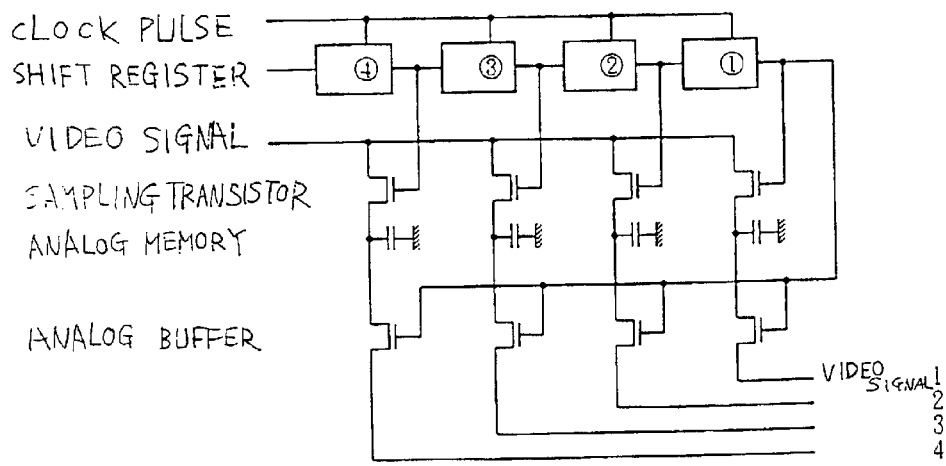
FIG. 10 is a view schematically showing a conventional video signal division (frequency division) circuit.
Figure 11:
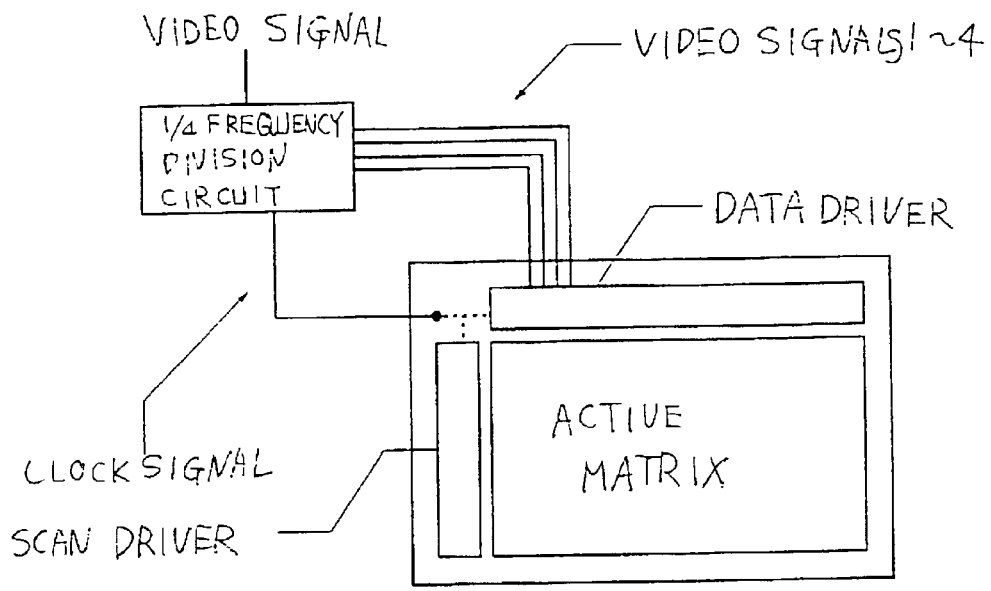
FIG. 11 is a view schematically showing a conventional active matrix device.
Figure 12:
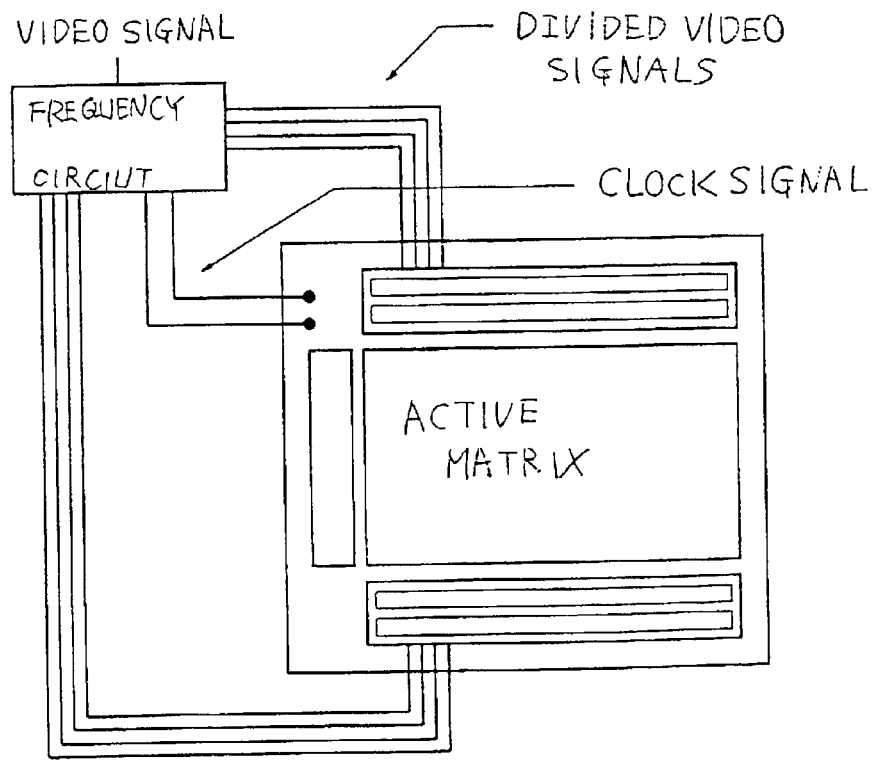
FIG. 12 is a view schematically showing a conventional active matrix device.

After the gettering step is ended in this way, as shown in FIG. 8D, the gettered region 605 is patterned to form an active layer 606. Next, as shown in FIG. 8E, similarly to the third embodiment, a gate insulating film is formed. First, an insulating film 607 is formed by a plasma CVD method. As the CVD insulating film 607, a silicon nitride oxide film with a thickness of 1000 Å is formed in this embodiment.

Next, a heat treatment is carried out at a temperature of 950° C. in an oxygen atmosphere containing HCl of 3%, so that the surface of the active layer 606 is thermally oxidized to grow a thermal oxidation film 608 with a thickness of 300 Å. This makes the film thickness of the active layer 606 about 250 Å. The thermal oxidation film 608 and the CVD oxidation film 607 constitute the gate insulating film. Subsequently, in accordance with the manufacturing steps shown in the first embodiment (FIG. 3) or second embodiment (FIG. 5), a thin film transistor may be fabricated.

Of course, at the formation of the thermal oxidation film 608 which becomes the gate insulating film, if the heat treatment is carried out in an atmosphere containing a halogen element, there is obtained a synergy effect of the gettering effect by the phosphorus element of this embodiment and the gettering effect by the halogen element.

In this embodiment, although phosphorus is added into the gettering region 604, boron with a concentration higher than phosphorus may be added in addition to phosphorus. In this case, it is found that the gettering effect is higher than the case where only phosphorus is added. It is also found that the gettering effect can not be obtained by addition of only boron.

In the case where a nine-stage ring oscillator is constituted by combining P-TFTs and N-TFTs obtained by using the method disclosed in the above embodiments, it is possible to make the oscillator oscillate at a frequency of not less than 400 MHz. In general, in view of the fact that actual circuit design is carried out with a frequency of about 10% of oscillation frequency of a ring oscillator, it is possible to constitute a circuit capable of operating at a frequency of about 40 MHz by the above TFTs.

As described above, by using the present invention disclosed in the present specification, it is possible to obtain thin film transistors capable of constituting a data driver circuit required a high speed operation (generally, an operation speed of tens M HZ or more). Accordingly, even in a large scale active matrix display device as shown in FIG. 1, a driver circuit can be integrally formed on the same substrate as the active matrix circuit with small number of, preferably single video terminal.

What is claimed is:

1. A method of manufacturing an active matrix display device which comprises an active matrix circuit including pixel electrodes and a data driver circuit for driving said active matrix circuit, said active matrix circuit and said data driver circuit being provided over a same substrate and having a thin film transistor, respectively, said method comprising the steps of:

forming an amorphous semiconductor film over said substrate;

providing said semiconductor film with a catalytic element for promoting crystallization of said semiconductor film;

crystallizing said amorphous semiconductor film by a first heat treatment to form a crystalline semiconductor film;

gettering said catalytic element in said crystalline semiconductor film by a second heat treatment; and etching said crystalline semiconductor film into a semiconductor layer for said thin film transistor of said data driver circuit, wherein the number of lines of shift register circuits constituting said data driver circuit is p, the number of video terminals inputted into said data driver circuit from an outside of said substrate is q, and the number of said pixel electrodes included in said active matrix circuit and driven by said data driver circuit is R, R/pq is from 50,000 to 3,000,000.

2. A method of manufacturing an active matrix display device according to claim 1, wherein said second heat treatment is conducted in an atmosphere containing a halogen element.

3. A method of manufacturing an active matrix display device according to claim 1, wherein said gettering step is a step in which an element in only group 15 or elements in group 15 and group 13 are selectively introduced into said crystalline semiconductor film to form an impurity region, and said second heat treatment is carried out to make gettering of said catalytic element in said impurity region.

4. A method of manufacturing an active matrix display device according to claim 1, wherein said catalytic element comprises one or plural kinds of elements selected from the group consisting of Fe, Co, Ni, Ru, Rh, Pd, Os, Ir, Pt, Cu and Au.

5. A method of manufacturing an active matrix display device according to claim 1, wherein a concentration of said catalytic element in said semiconductor layer of said thin film transistor constituting said data driver is $1 \times 10^{14}$ to $5 \times 10^{18}$ atoms/cm$^3$.

6. A method of manufacturing an active matrix display device according to claim 1, wherein a concentration of said catalytic element in said crystalline semiconductor film of said semiconductor layer of said thin film transistor constituting said data driver is $1 \times 10^{16}$ to $5 \times 10^{17}$ atoms/cm$^3$.

7. A method of manufacturing an active matrix display device according to claim 1, wherein a film thickness of an active layer of said thin film transistor constituting said data driver circuit is 100 Å to 750 Å.

8. A method of manufacturing an active matrix display device according to claim 1, wherein p=q=1.

9. A method of manufacturing an active matrix display device which comprises an active matrix circuit including pixel electrodes and a data driver circuit for driving said active matrix circuit, said active matrix circuit and said data driver circuit comprising a thin film transistor, respectively, said method comprising the steps of:

forming an amorphous semiconductor film over a substrate;

providing said semiconductor film with a catalytic element for promoting crystallization of said semiconductor film;

crystallizing said amorphous semiconductor film by a first heat treatment to form a crystalline semiconductor film;

gettering said catalytic element in said crystalline semiconductor film by a second heat treatment;

etching said crystalline semiconductor film into a semiconductor layer for said thin film transistor;

forming a thermal oxidation film constituting a gate insulating film by oxidizing a surface of said semiconductor layer;

wherein the number of lines of shift register circuits constituting said data driver circuit is p, the number of video terminals inputted into said data driver circuit from an outside of said substrate is q, and the number of said pixel electrodes included in said active matrix circuit and driven by said data driver circuit is R, R/pq is from 50,000 to 3,000,000.

10. A method of manufacturing an active matrix display device according to claim 9, wherein said thermal oxidation film is thicker than said semiconductor layer.

11. A method of manufacturing an active matrix display device according to claim 9, wherein said second heat treatment is conducted in an atmosphere containing a halogen element.

12. A method of manufacturing an active matrix display device according to claim 9, wherein said gettering step is a step in which an element in only group 15 or elements in group 15 and group 13 are selectively introduced into said crystalline semiconductor film to form an impurity region, and said second heat treatment is carried out to make gettering of said catalytic element in said impurity region.

13. A method of manufacturing an active matrix display device according to claim 9, wherein said catalytic element comprises one or plural kinds of elements selected from the group consisting of Fe, Co, Ni, Ru, Rh, Pd, Os, Ir, Pt, Cu and Au.

14. A method of manufacturing an active matrix display device according to claim 9, wherein a concentration of said catalytic element in said semiconductor layer of said thin film transistor constituting said data driver is $1\times10^{14}$ to $5\times10^{18}$ atoms/cm$^3$.

15. A method of manufacturing an active matrix display device according to claim 9, wherein a concentration of said catalytic element in said crystalline semiconductor film of said semiconductor layer of said thin film transistor constituting said data driver is $1\times10^{16}$ to $5\times10^{17}$ atoms/cm$^3$.

16. A method of manufacturing an active matrix display device according to claim 9, wherein a film thickness of an active layer of said thin film transistor constituting said data driver circuit is 100 Å to 750 Å.

17. A method of manufacturing an active matrix display device according to claim 9, wherein p=q=1.

18. A method of manufacturing an active matrix display device which comprises an active matrix circuit including pixel electrodes and a data driver circuit for driving said active matrix circuit, said active matrix circuit and said data driver circuit comprising a thin film transistor, respectively, said method comprising the steps of:

forming an amorphous semiconductor film over a substrate having an insulating film;

providing said semiconductor film with a catalytic element for promoting crystallization of said semiconductor film;

crystallizing said amorphous semiconductor film by a first heat treatment to form a crystalline semiconductor film;

gettering said catalytic element in said crystalline semiconductor film by a second heat treatment;

etching said crystalline semiconductor film into a semiconductor layer for said thin film transistor;

forming an insulating film in contact with an active layer through a vapor phase method; and forming a thermal oxidation film constituting a gate insulating film by oxidizing a surface of said semiconductor layer;

wherein the number of lines of shift register circuits constituting said data driver circuit is p, the number of video terminals inputted into said data driver circuit from an outside of said substrate is q, and the number of said pixel electrodes included in said active matrix circuit and driven by said data driver circuit is R, R/pq is from 50,000 to 3,000,000.

19. A method of manufacturing an active matrix display device according to claim 18, wherein said thermal oxidation film is thicker than said semiconductor layer.

20. A method of manufacturing an active matrix display device according to claim 18, wherein said second heat treatment is conducted in an atmosphere containing a halogen element.

21. A method of manufacturing an active matrix display device according to claim 18, wherein said gettering step is a step in which an element in only group 15 or elements in group 15 and group 13 are selectively introduced into said crystalline semiconductor film to form an impurity region, and said second heat treatment is carried out to make gettering of said catalytic element in said impurity region.

22. A method of manufacturing an active matrix display device according to claim 18, wherein said catalytic element comprises one or plural kinds of elements selected from the group consisting of Fe, Co, Ni, Ru, Rh, Pd, Os, Ir, Pt, Cu and Au.

23. A method of manufacturing an active matrix display device according to claim 18, wherein a concentration of said catalytic element in said semiconductor layer of said thin film transistor constituting said data driver is $1\times10^{14}$ to $5\times10^{18}$ atoms/cm$^3$.

24. A method of manufacturing an active matrix display device according to claim 18, wherein a concentration of said catalytic element in said crystalline semiconductor film of said semiconductor layer of said thin film transistor constituting said data driver is $1\times10^{16}$ to $5\times10^{17}$ atoms/cm$^3$.

25. A method of manufacturing an active matrix display device according to claim 18, wherein a film thickness of said active layer of said thin film transistor constituting said data driver circuit is 100 Å to 750 Å.

26. A method of manufacturing an active matrix display device according to claim 18, wherein p=q=1.

27. A method of manufacturing an active matrix display device which comprises an active matrix circuit including pixel electrodes and a data driver circuit for driving said active matrix circuit, said active matrix circuit and said data driver circuit being provided over a same substrate and having a thin film transistor, respectively, said method comprising the steps of:

forming an amorphous semiconductor film over said substrate;

providing said semiconductor film with a catalytic element for promoting crystallization of said semiconductor film;

crystallizing said amorphous semiconductor film by a first heat treatment to form a crystalline semiconductor film;

reducing a concentration of said catalytic element in said crystalline semiconductor film by a second heat treatment; and etching said crystalline semiconductor film into a semiconductor layer for said thin film transistor of said data driver circuit, wherein the number of lines of shift register circuits constituting said data driver circuit is p, the number of video terminals inputted into said data driver circuit from an outside of said substrate is q, and the number of said pixel electrodes included in said active matrix circuit and driven by said data driver circuit is R, R/pq is from 50,000 to 3,000,000.

28. A method of manufacturing an active matrix display device according to claim 27, wherein said second heat treatment is conducted in an atmosphere containing a halogen element.

29. A method of manufacturing an active matrix display device according to claim 27, wherein said reducing step is a step in which an element in only group 15 or elements in group 15 and group 13 are selectively introduced into said crystalline semiconductor film to form an impurity region, and said second heat treatment is carried out to make gettering of said catalytic element in said impurity region.

30. A method of manufacturing an active matrix display device according to claim 27, wherein said catalytic element comprises one or plural kinds of elements selected from the group consisting of Fe, Co, Ni, Ru, Rh, Pd, Os, Ir, Pt, Cu and Au.

31. A method of manufacturing an active matrix display device according to claim 27, wherein a concentration of said catalytic element in said semiconductor layer of said thin film transistor constituting said data driver is $1\times10^{14}$ to $5\times10^{18}$ atoms/cm$^3$.

32. A method of manufacturing an active matrix display device according to claim 27, wherein a concentration of said catalytic element in said crystalline semiconductor film of said semiconductor layer of said thin film transistor constituting said data driver is $1\times10^{16}$ to $5\times10^{17}$ atoms/cm$^3$.

33. A method of manufacturing an active matrix display device according to claim 27, wherein a film thickness of an active layer of said thin film transistor constituting said data driver circuit is 100 Å to 750 Å.

34. A method of manufacturing an active matrix display device according to claim 27, wherein p=q=1.

35. A method of manufacturing an active matrix display device which comprises an active matrix circuit including pixel electrodes and a data driver circuit for driving said active matrix circuit, said active matrix circuit and said data driver circuit comprising a thin film transistor, respectively, said method comprising the steps of:

forming an amorphous semiconductor film over a substrate;

providing said semiconductor film with a catalytic element for promoting crystallization of said semiconductor film;

crystallizing said amorphous semiconductor film by a first heat treatment to form a crystalline semiconductor film;

reducing a concentration of said catalytic element in said crystalline semiconductor film by a second heat treatment;

etching said crystalline semiconductor film into a semiconductor layer for said thin film transistor, forming a thermal oxidation film constituting a gate insulating film by oxidizing a surface of said semiconductor layer, wherein the number of lines of shift register circuits constituting said data driver circuit is p, the number of video terminals inputted into said data driver circuit from an outside of said substrate is q, and the number of said pixel electrodes included in said active matrix circuit and driven by said data driver circuit is R, R/pq is from 50,000 to 3,000,000.

36. A method of manufacturing an active matrix display device according to claim 35, wherein said thermal oxidation film is thicker than said semiconductor layer.

37. A method of manufacturing an active matrix display device according to claim 35, wherein said second heat treatment is conducted in an atmosphere containing a halogen element.

38. A method of manufacturing an active matrix display device according to claim 35, wherein said reducing step is a step in which an element in only group 15 or elements in group 15 and group 13 are selectively introduced into said crystalline semiconductor film to form an impurity region, and said second heat treatment is carried out to make gettering of said catalytic element in said impurity region.

39. A method of manufacturing an active matrix display device according to claim 35, wherein said catalytic element comprises one or plural kinds of elements selected from the group consisting of Fe, Co, Ni, Ru, Rh, Pd, Os, Ir, Pt, Cu and Au.

40. A method of manufacturing an active matrix display device according to claim 35, wherein a concentration of said catalytic element in said semiconductor layer of said thin film transistor constituting said data driver is $1\times10^{14}$ to $5\times10^{18}$ atoms/cm$^3$.

41. A method of manufacturing an active matrix display device according to claim 35, wherein a concentration of said catalytic element in said crystalline semiconductor film of said semiconductor layer of said thin film transistor constituting said data driver is $1\times10^{16}$ to $5\times10^{17}$ atoms/cm$^3$.

42. A method of manufacturing an active matrix display device according to claim 35, wherein a film thickness of an active layer of said thin film transistor constituting said data driver circuit is 100 Å to 750 Å.

43. A method of manufacturing an active matrix display device according to claim 35, wherein p=q=1.

44. A method of manufacturing an active matrix display device which comprises an active matrix circuit including pixel electrodes and a data driver circuit for driving said active matrix circuit, said active matrix circuit and said data driver circuit comprising a thin film transistor, respectively, said method comprising the steps of:

forming an amorphous semiconductor film over a substrate having an insulating film;

providing said semiconductor film with a catalytic element for promoting crystallization of said semiconductor film;

crystallizing said amorphous semiconductor film by a first heat treatment to form a crystalline semiconductor film;

reducing a concentration of said catalytic element in said crystalline semiconductor film by a second heat treatment;

etching said crystalline semiconductor film into a semiconductor layer for said thin film transistor, forming an insulating film in contact with an active layer through a vapor phase method; and forming a thermal oxidation film constituting a gate insulating film by oxidizing a surface of said semiconductor layer, wherein the number of lines of shift register circuits constituting said data driver circuit is p, the number of video terminals inputted into said data driver circuit from an outside of said substrate is q, and the number of said pixel electrodes included in said active matrix circuit and driven by said data driver circuit is R, R/pq is from 50,000 to 3,000,000.

45. A method of manufacturing an active matrix display device according to claim 44, wherein said thermal oxidation film is thicker than said semiconductor layer.

46. A method of manufacturing an active matrix display device according to claim 44, wherein said second heat treatment is conducted in an atmosphere containing a halogen element.

47. A method of manufacturing an active matrix display device according to claim 44, wherein said reducing step is a step in which an element in only group 15 or elements in group 15 and group 13 are selectively introduced into said crystalline semiconductor film to form an impurity region, and said second heat treatment is carried out to make gettering of said catalytic element in said impurity region.

48. A method of manufacturing an active matrix display device according to claim 44, wherein said catalytic element comprises one or plural kinds of elements selected from the group consisting of Fe, Co, Ni, Ru, Rh, Pd, Os, Ir, Pt, Cu and Au.

49. A method of manufacturing an active matrix display device according to claim 44, wherein a concentration of said catalytic element in said semiconductor layer of said thin film transistor constituting said data driver is $1\times10^{14}$ to $5\times10^{18}$ atoms/cm$^3$.

50. A method of manufacturing an active matrix display device according to claim 44, wherein a concentration of said catalytic element in said crystalline semiconductor film of said semiconductor layer of said thin film transistor constituting said data driver is $1\times10^{16}$ to $5\times10^{17}$ atoms/cm$^3$.

51. A method of manufacturing an active matrix display device according to claim 44, wherein a film thickness of said active layer of said thin film transistor constituting said data driver circuit is 100 Å to 750 Å.

52. A method of manufacturing an active matrix display device according to claim 44, wherein p=q=1.

* * * * *